(12) United States Patent
Okazaki et al.

(10) Patent No.: US 9,231,626 B2
(45) Date of Patent: Jan. 5, 2016

(54) WIRELESS COMMUNICATION APPARATUS, DOHERTY AMPLIFIER, AND METHOD FOR CONTROLLING WIRELESS COMMUNICATION

(71) Applicant: FUJITSU LIMITED, Kawasaki-shi, Kanagawa (JP)

(72) Inventors: Yousuke Okazaki, Kawasaki (JP); Hiroaki Maeda, Yokohama (JP); Hirotake Honda, Yokohama (JP); Yoshinobu Shizawa, Yokohama (JP); Hiroyuki Ogawa, Yokosuka (JP); Yasuhiro Okawa, Sendai (JP)

(73) Assignee: FUJITSU LIMITED, Kawasaki (JP)

( * ) Notice: Subject to any disclaimer, the term of this patent is extended or adjusted under 35 U.S.C. 154(b) by 53 days.

(21) Appl. No.: 14/049,013

(22) Filed: Oct. 8, 2013

(65) Prior Publication Data

US 2014/0155122 A1    Jun. 5, 2014

(30) Foreign Application Priority Data

Dec. 3, 2012 (JP) .................................. 2012-264753

(51) Int. Cl.

| H01Q 11/12 | (2006.01) |
|---|---|
| H04B 1/04 | (2006.01) |
| H03F 1/02 | (2006.01) |
| H03F 1/56 | (2006.01) |
| H04B 1/034 | (2006.01) |

(52) U.S. Cl.
CPC ............ *H04B 1/0475* (2013.01); *H03F 1/0288* (2013.01); *H03F 1/56* (2013.01); *H03F 2200/111* (2013.01); *H03F 2200/387* (2013.01); *H04B 2001/0425* (2013.01); *H04B 2001/0433* (2013.01)

(58) Field of Classification Search
CPC .................................. H03F 1/0288; H03F 1/07
USPC .................................... 455/127.3; 330/124 R
See application file for complete search history.

(56) References Cited

U.S. PATENT DOCUMENTS

| 2008/0088376 A1 | 4/2008 | Tateoka et al. |
|---|---|---|
| 2011/0279178 A1* | 11/2011 | Outaleb et al. ............. 330/124 R |
| 2012/0025916 A1* | 2/2012 | Deguchi ........................ 330/295 |

FOREIGN PATENT DOCUMENTS

| JP | 2005-521275 A | 7/2005 |
|---|---|---|
| JP | 2007-134977 A | 5/2007 |
| JP | 2008-118624 A | 5/2008 |
| JP | 2011-182313 A | 9/2011 |
| WO | WO 03/021775 A1 | 3/2003 |

* cited by examiner

*Primary Examiner* — Lee Nguyen
(74) *Attorney, Agent, or Firm* — Arent Fox LLP

(57) ABSTRACT

A wireless communication apparatus includes: a first amplifier configured to amplify an input signal; a second amplifier configured to amplify the input signal when an input level of the input signal is equal to or larger than a given level; an impedance converter configure to switch an load impedance of the first amplifier and output a composite output of an output from the first amplifier and an output from the second amplifier; an impedance controller section configured to control a switching of the load impedance of the first amplifier based on a bandwidth of the input signal; a distortion compensation section configured to perform distortion compensation of the input signal and supply a compensated input signal to the first amplifier and the second amplifier; and a filter section configured to limit a band of a signal output from the impedance converter.

20 Claims, 10 Drawing Sheets

| BANDWIDTH SETTING | TRANSMISSION POWER SETTING | SWITCH OPERATION |
|---|---|---|
| 1MHz | 10 W OR LESS | OFF |
| 1MHz | 10 W OR MORE | ON |
| 5MHz | 10 W OR LESS | OFF |
| 5MHz | 10 W OR MORE | ON |
| 10MHz | 10 W OR MORE | ON |
| 20MHz | 10 W OR MORE | ON |

WIRELESS COMMUNICATION APPARATUS, DOHERTY AMPLIFIER, AND METHOD FOR CONTROLLING WIRELESS COMMUNICATION

CROSS-REFERENCE TO RELATED APPLICATION

This application is based upon and claims the benefit of priority from the prior Japanese Patent Application No. 2012-264753 filed on Dec. 3, 2012, the entire contents of which are incorporated herein by reference.

FIELD

Embodiments discussed herein relate to wireless communication apparatuses, Doherty amplifiers, and methods for controlling wireless communication.

BACKGROUND

A wireless base station apparatus includes, for example, a wireless controller apparatus and a wireless apparatus. The wireless apparatus includes a power amplifier section, a distortion compensation section, and a filter section. The power amplifier section amplifies a base band signal up to a high output power radio signal. The distortion compensation section compensates non-linear distortions. The filter section removes output noise.

Related art is disclosed in Japanese Laid-open Patent Publication No. 2011-182313.

SUMMARY

According to one aspect of the embodiments, a wireless communication apparatus includes: a first amplifier configured to amplify an input signal; a second amplifier configured to amplify the input signal when an input level of the input signal is equal to or larger than a given level; an impedance converter configure to switch an load impedance of the first amplifier and output a composite output of an output from the first amplifier and an output from the second amplifier; an impedance controller section configured to control a switching of the load impedance of the first amplifier based on a bandwidth of the input signal; a distortion compensation section configured to perform distortion compensation of the input signal and supply a compensated input signal to the first amplifier and the second amplifier; and a filter section configured to limit a band of a signal output from the impedance converter.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 illustrates an example of load impedance during a low output power operation and in a state where a switch is on;

FIG. 9 illustrates an example of a correspondence table between bandwidths, transmission powers, and controls of the impedance converter.

DESCRIPTION OF EMBODIMENTS

For example, a wireless apparatus has highly efficient and highly linear characteristics since a distortion compensation section compensates non-linear noises produced from a power amplifier section including a Doherty amplifier circuit. In the wireless apparatus, a band-pass filter or the like is used to remove a noise signal produced from the power amplifier section to meet a noise standard.

Due to a re-arrangement of frequency band or the like, frequency gaps between transmission bands and reception bands as well as frequency band gaps with other wireless system bands may become narrower. Accordingly, a more strict noise standard may be desirable for the wireless apparatus.

In an impedance converter circuit of the Doherty amplifier, an impedance conversion ratio of the impedance converter circuit is switched by switching a thickness of dielectric material arranged between a stripline and ground by using a switch.

In a wireless base station apparatus, a different signal bandwidth and a different carrier arrangement may be employed depending on area. In the filter section of the wireless apparatus which is designed with a maximum transmission bandwidth, a band of a transmission signal may become narrower relative to a filter passing band. In such a case, a filter function may decrease, and a filter attenuation amount may not be expected. Thus, the removal of noise may become difficult. Accordingly, it may be desirable to set the value of distortion standard depending on the signal bandwidth. It is desirable to improve the linearity of the power amplifier section in order to obtain a distortion characteristic that satisfies the value of distortion standard. However, the linearity, for example, a low distortion characteristic and the highly efficient characteristic are a trade-off.

The wireless communication apparatuses, Doherty amplifiers, and wireless communication apparatus control methods disclosed herein are not limited by the following embodiments. An exemplary configuration, in which the load impedance of the impedance converter is switched by using a capacitor and a switch, is not limited to a configuration to be described below.

Figure 1:
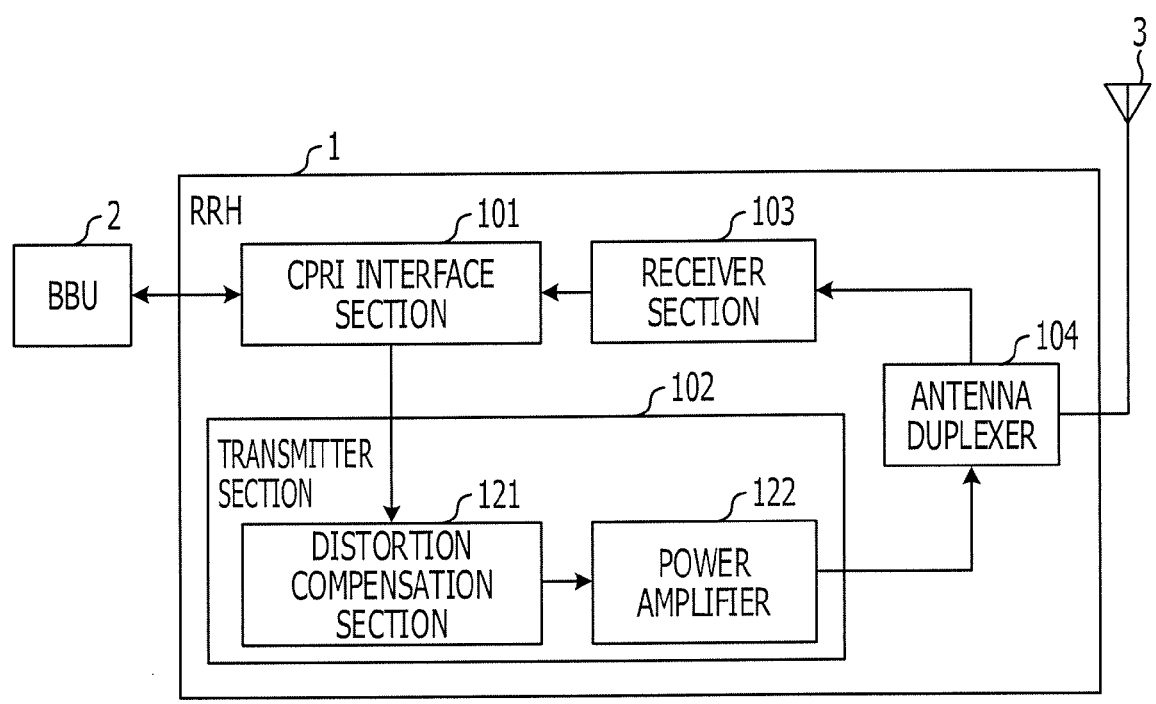
FIG. 1 illustrates an example of a wireless base station system.

FIG. 1 illustrates an example of a wireless base station system. As illustrated in FIG. 1, the wireless base station system includes a remote radio head (RRH) 1, a base band unit (BBU) 2, and an antenna 3.

The BBU 2 may be a wireless controller section or a wireless controller apparatus, and carries out a base band process, a signal transmission and reception control, or the like.

The RRH 1 may be a wireless section or a wireless apparatus, and includes a Common Public Radio Interface (CPRI)

interface section 101, a transmitter section 102, a receiver section 103, and an antenna duplexer 104.

The CPRI interface section 101 may be a standardized protocol interface between the wireless controller section and the wireless section. The CPRI interface section 101 receives a signal from the BBU 2 by using a CPRI protocol. The CPRI interface section 101 transmits a signal to the BBU 2 by using the CPRI protocol. For a communication interface between the RRH 1 and the BBU 2, the CPRI interface may be used as the standardized interface. Alternatively, another interface may be used as well. For example, for the communication interface between the RRH 1 and the BBU 2, Open Base Station Architecture Initiative (OBSAI) or the like may be used.

The transmitter section 102 performs a modulation process or the like on a base band signal or the like from the BBU 2 so as to convert it into a radio signal, and outputs the radio signal to the antenna duplexer 104.

For example, the transmitter section 102 includes a distortion compensation section 121 and a power amplifier 122. The distortion compensation section 121 performs distortion compensation so as to reduce distortions in a signal. The distortions may be produced during amplification performed by the power amplifier 122. The power amplifier 122 amplifies the signal subjected to the distortion compensation.

The antenna duplexer 104 transmits a signal input from the transmitter section 102 to an external apparatus via the antenna 3. The antenna duplexer 104 receives a signal transmitted from an external apparatus via the antenna 3. The antenna duplexer 104 outputs a received signal to the receiver section 103.

The receiver section 103 receives the signal transmitted from an external apparatus from the antenna duplexer 104. The receiver section 103 performs a demodulation process and the like on the received signal so as to convert the received signal to a base band signal. The receiver section 103 transmits the base band signal to the BBU 2 through the CPRI interface section 101.

Figure 2:
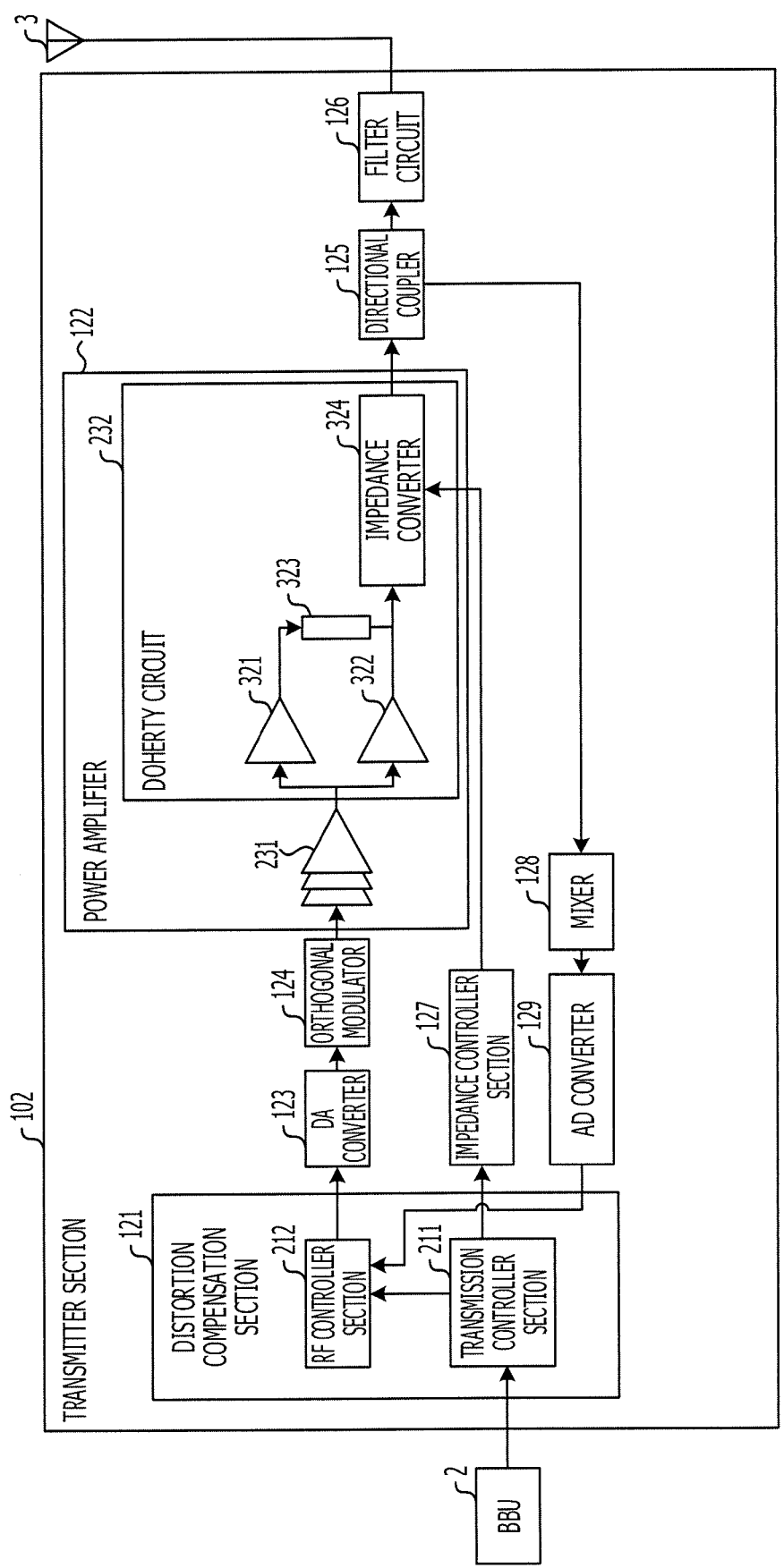
FIG. 2 illustrates an example of a transmitter section.

FIG. 2 illustrates an example of the transmitter section.

As illustrated in FIG. 2, the transmitter section 102 includes, in addition to the distortion compensation section 121 and the power amplifier 122 illustrated in FIG. 1, a digital-analog (DA) converter 123, an orthogonal modulator 124, a directional coupler 125, and a filter circuit 126. The transmitter section 102 further includes an impedance converter section 127, a mixer 128, and an analog-digital (AD) converter 129.

The distortion compensation section 121 performs the distortion compensation by digital pre-distortion (DPD) method. The distortion compensation section 121 includes a transmission controller section 211 and a radio frequency (RF) controller section 212. For the sake of explanation, the CPRI interface section 101 is omitted from FIG. 2. However, the distortion compensation section 121 receives a signal from the BBU 2 via the CPRI interface section 101. The description regarding operations of the CPRI interface section 101 during transmissions and receptions of signals between the distortion compensation section 121 and the BBU 2 may be omitted in the following description.

The transmission controller section 211 receives signals from the BBU 2. For example, the transmission controller section 211 receives a base band signal and a control signal from the BBU 2. The base band signal includes data to be transmitted. The control signal is a signal for controlling the transmission of signal. The control signal may include, for example, a bandwidth and frequency of an input signal that is to be input from the BBU 2 to the RRH 1, position information, a reset signal, commands to stop the transmission, execute the transmission, or the like. The control signal may include information of transmission power or the like.

The transmission controller section 211 transmits an instruction to the RF controller section 212 and the impedance controller section 127 to initialize setting when the transmission controller section 211 receives the control signal that includes the reset signal.

The transmission controller section 211 transmits an instruction to the RF controller section 212 to stop a signal transmission when the transmission controller section 211 receives the control signal that includes the transmission stop instruction. The transmission controller section 211 transmits an instruction to the RF controller section 212 to execute a signal transmission when the transmission controller section 211 receives the control signal that includes the transmission execution instruction.

Figure 3:
FIG. 3 illustrates an example of a correspondence table between a bandwidth and a control of an impedance converter.

The transmission controller section 211 stores correspondences between the bandwidths and the controls of the impedance converter 324. The transmission controller section 211 stores, for example, a correspondence table 400 illustrated in FIG. 3. FIG. 3 illustrates an example of a correspondence table between a bandwidth and a control of an impedance converter. The correspondence table 400 indicates the correspondence between the bandwidth and the control of the impedance converter 324 when the maximum bandwidth to be used is 20 MHz. The control of the impedance converter 324 is switched between when the bandwidth of input signal is a narrow band and when the bandwidth of input signal is not the narrow band. The narrow band in the bandwidth of input signal includes, for example, a case where the narrow band of an input signal is narrower than one third of the maximum bandwidth. One third of the maximum bandwidth may be a given value. For example, when the maximum bandwidth to be used is 15 MHz, the narrow band may be equal to 5 MHz or less. The load impedance conversion performed by the impedance converter 324 may be set according to the bandwidth of input signal, conditions of respective impedances, or the like. For example, when the bandwidth of input signal is the narrow band, the control may be performed so as that a load impedance of a carrier amplifier 321 is in agreement with the load impedance of the impedance converter 324. For example, the control may be performed so as that the load impedance of the carrier amplifier 321 becomes 50Ω.

Figure 4:
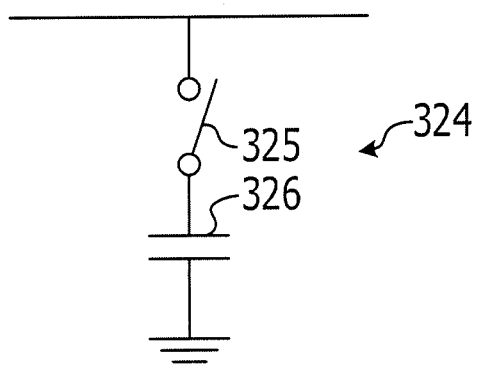
FIG. 4 illustrates an example of an impedance converter.

FIG. 4 illustrates an example of an impedance converter. The impedance converter 324 has a configuration illustrated in FIG. 4. Thus, in FIG. 3, the control of the impedance converter 324 is indicated as on or off of a switch.

The transmission controller section 211 determines the control of the impedance converter 324 in response to the bandwidth that is obtained by stepwise division. Another method may alternatively be used to determine the control. For example, the transmission controller section 211 may store a control for a case where the bandwidth of input signal is less than one third of the maximum bandwidth and a control for a case where the bandwidth of input signal is equal to or larger than one third of the maximum bandwidth, and determine the control of the impedance converter 324 in response to the received bandwidth.

The transmission controller section 211 obtains the bandwidth of input signal from the received control signal. Subsequently, the transmission controller section 211 obtains from the correspondence table 400 information regarding the control of the impedance converter 324 that corresponds to the obtained bandwidth. For example, when the bandwidth of input signal is 5 MHz, the transmission controller section 211 obtains information of the control to turn off the switch of the impedance converter 324. In response to the obtained information of the control, the transmission controller section 211 transmits an instruction to the impedance controller section 127 to control the switch of the impedance converter 324. For example, when the bandwidth of input signal is 5 MHz, the transmission controller section 211 sends an instruction to the impedance controller section 127 to turn off the switch of the impedance converter 324.

The transmission controller section 211 outputs the received base band signal to the RF controller section 212.

The RF controller section 212 receives an input signal that is the base band signal from the transmission controller section 211. The RF controller section 212 receives a feedback signal from the AD converter 219. The RF controller section 212 compares the input signal and the feedback signal, and obtains an error signal. The RF controller section 212 calculates a distortion compensation coefficient from the error signal and updates a stored distortion compensation coefficient. The RF controller section 212 performs the distortion compensation by performing a digital predistortion process on the subsequent input signal with the updated distortion compensation coefficient. The RF controller section 212 outputs the input signal subjected to the distortion compensation process to the DA converter 123.

The DA converter 123 receives the input signal subjected to the distortion compensation process from the RF controller section 212. Because the input signal is a digital signal, the DA converter 123 converts the input signal that is a digital signal into an analog signal. The DA converter 123 outputs the input signal that is converted into an analog signal to the orthogonal modulator 124.

The orthogonal modulator 124 receives the input signal that is converted into an analog signal from the DA converter 123. The orthogonal modulator 124 performs a modulation process on the input signal. The orthogonal modulator 124 performs a frequency conversion on the input signal to convert the input signal to a RF signal. Subsequently, the orthogonal modulator 124 outputs the input signal that is an RF signal to the power amplifier 122. The orthogonal modulator 124 may be referred to as a quadrature modulator (QMOD).

The power amplifier 122 includes an amplifier 231 and a Doherty circuit 232.

The amplifier 231 receives the input signal that is an RF signal from the orthogonal modulator 124. The amplifier 231 amplifies the input signal. The amplifier 231 outputs the amplified input signal to the Doherty circuit 232.

The Doherty circuit 232 includes the carrier amplifier 321, a peak amplifier 322, an impedance converter 323, and the impedance converter 324.

The carrier amplifier 321 receives one of signals obtained by dividing the input signal from the amplifier 231. The carrier amplifier 321 amplifies the received input signal. The carrier amplifier 321 outputs the amplified signal to the impedance converter 323. The carrier amplifier 321 may correspond to a first amplifier.

The peak amplifier 322 receives the other signal obtained by dividing the input signal from the amplifier 231. The peak amplifier 322 is turned off when an input level of the input signal is less than a given value. When the carrier amplifier 321 reaches saturation power completely, the peak amplifier 322 amplifies the input signal. The peak amplifier 322 outputs the amplified input signal to a composition point at which the amplified input signal is added to the output from the impedance converter 323. The peak amplifier 322 reaches the saturation power with the carrier amplifier 321. The peak amplifier 322 may correspond to a second amplifier.

The impedance converter 323 may be a transmission line that has an electrical length of λ/4 and a resistance of 50Ω. The impedance converter 323 is coupled to an output terminal of the carrier amplifier 321. The impedance converter 323 performs the impedance conversion in such a way that, for example, the load impedance of the carrier amplifier 321 becomes twice the load to be added to an output terminal of the impedance converter 324 at power with which only the carrier amplifier 321 operates. The impedance converter 323 performs the impedance conversion in such a way that, for example, each of the load impedances of the carrier amplifier 321 and the peak amplifier 322 becomes substantially equal to the load impedance of the impedance converter 324 at power with which both the carrier amplifier 321 and the peak amplifier 322 operate.

The impedance converter 324 matches the impedance of a node, where outputs of the carrier amplifier 321 and the peak amplifier 322 are combined, with the subsequent stage's characteristics. For example, as illustrated in FIG. 4, in the impedance converter 324, a capacitor 326 is connected to the transmission line through a switch 325, and the other end of the capacitor 326 is connected to ground (GraND: GND). The switch 325 is positioned, for example, so as that the distance to that position from the composition point where the outputs from the carrier amplifier 321 and the peak amplifier 322 are combined falls in from (1/10)λ to (1/12)λ (λ is the wavelength of input signal).

The impedance converter 324 may have substantially the same function as a transmission line having an electric length of λ/4 and a resistance of 35Ω when the switch 325 is on. The impedance converter 324 may have substantially the same function as a transmission line of 50Ω when the switch 325 is off.

In the impedance converter 324, the switch 325 is turned on or off based on the control from the impedance controller section 127. For example, when the bandwidth setting of input signal is 1 MHz or 5 MHz, the impedance converter 324 turns the switch 325 off based on the control from the impedance controller section 127. When the bandwidth setting of input signal is 10 MHz or 20 MHz, the impedance converter 324 turns the switch 325 on based on the control from the impedance controller section 127.

At the power with which only the carrier amplifier 321 operates, the impedance converter 324 performs the impedance conversion so as that the load impedance of the carrier amplifier 321 becomes twice the load impedance of the impedance converter 324 when the switch 325 is on. Furthermore, the impedance converter 324 performs the impedance conversion so as that the load impedance of the carrier amplifier 321 becomes substantially equal to the load impedance of the impedance converter 324 when the switch 325 is off.

The switch 325 of the impedance converter 324 is turned on when the power is such that both the carrier amplifier 321 and the peak amplifier 322 operate. In such a case, the impedance converter 324 performs the impedance conversion so as that the load impedance of the carrier amplifier 321 becomes substantially equal to the load impedance of the impedance converter 324.

Figure 5:
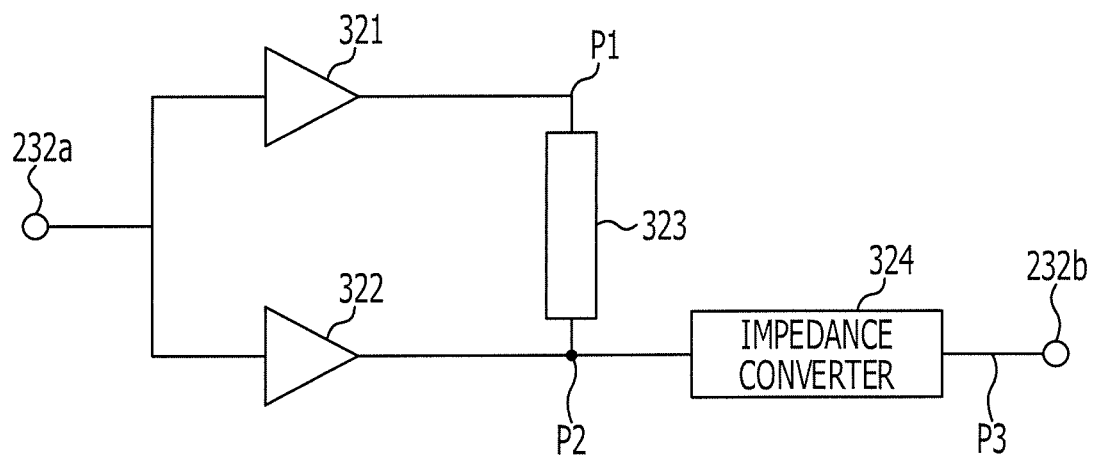
FIG. 5 illustrates an example of load impedance during a high output power operation.
Figure 6:
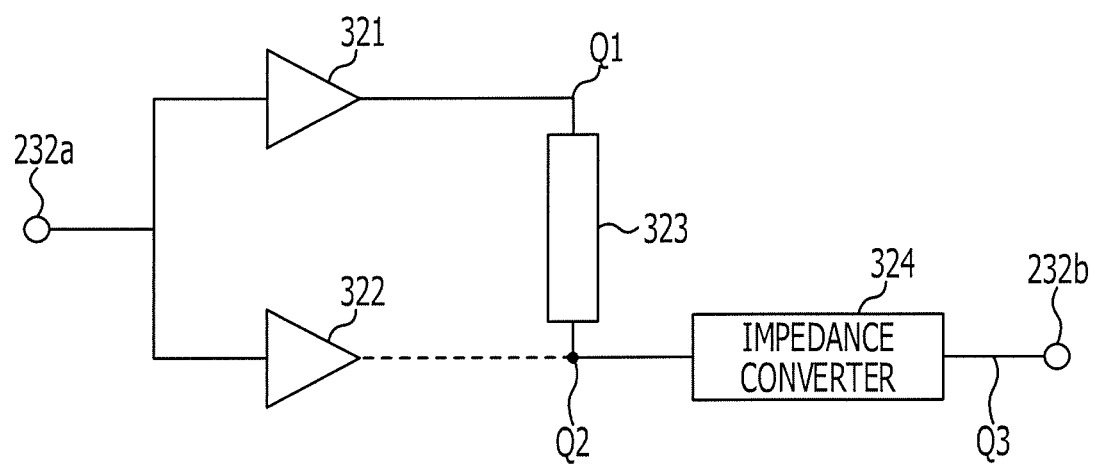
FIG. 6 illustrates an example of load impedance during a low output power operation and in a state where a switch is off.
Figure 7:
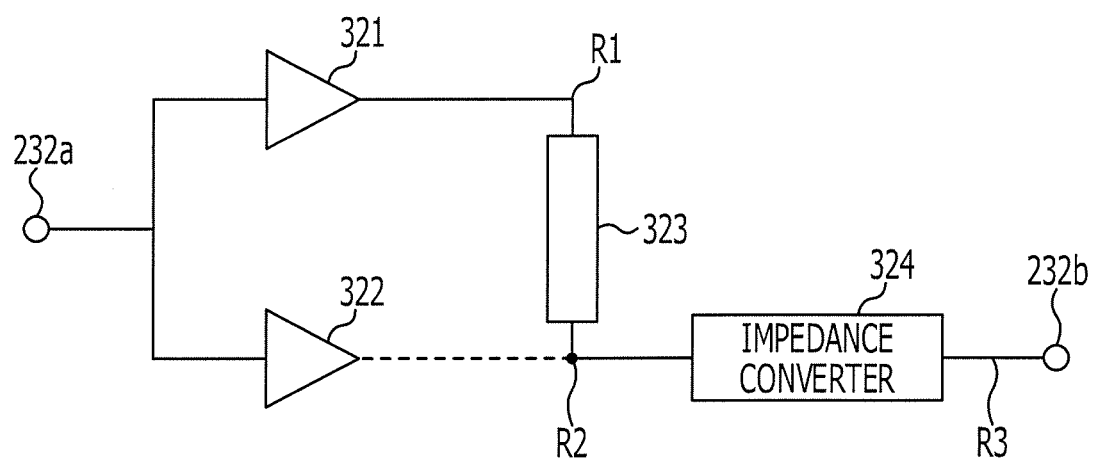

The load impedance changes with on and off of the switch 325 of the impedance converter 324. FIG. 5 illustrates an example of a load impedance during a high output power operation. FIG. 6 illustrates an example of a load impedance during a low output power operation and in a state where the switch is off. FIG. 7 illustrates an example of a load impedance during a low output power operation and in a state where the switch is on. Terminals 232a and 232b illustrated in FIG.

5 to FIG. 7 may correspond to an input terminal and an output terminal of the Doherty circuit 232, respectively.

FIG. 5 illustrates a case where both the carrier amplifier 321 and the peak amplifier 322 are in operation. The switch 325 of the impedance converter 324 is being turned on. In this case, the load impedance of the carrier amplifier 321 at a point P1 may be 50Ω. The load impedance of the peak amplifier 322 may also be 50Ω. The load impedance at a point P2, which is the composition point where the outputs from the carrier amplifier 321 and the peak amplifier 322 are combined, may be 25Ω. The load impedance of the impedance converter 324 at a point P3 may be 50Ω. Each of the load impedances of the carrier amplifier 321 and the peak amplifier 322 may be substantially equal to the load impedance of the impedance converter 324.

In FIG. 6, only the carrier amplifier 321 is in operation, and the switch 325 of the impedance converter 324 is being turned off. The peak amplifier 322 is off. A path from the output of the peak amplifier 322 is illustrated with a dotted line to indicate that the path is logically disconnected. The load impedance of the carrier amplifier 321 at a point Q1 may be 50Ω. The load impedance at a point Q2 may be 50Ω. The load impedance of the impedance converter 324 at a point Q3 may be 50Ω. The load impedance at the point Q1 is substantially equal to the load impedance at the point Q3. For example, the load impedance at any point between the point Q1 and the point Q3 may be substantially equal to 50Ω.

In FIG. 7, only the carrier amplifier 321 is in operation, and the switch 325 of the impedance converter 324 is being turned on. In this case, the load impedance of the carrier amplifier 321 at a point R1 may be 100Ω. The load impedance at a point R2 may be 25Ω. The load impedance of the impedance converter 324 at a point R3 may be 50Ω. The load impedance at the point R1 is substantially twice the load impedance at the point R3.

For the impedance converter 324, a preferable example of load impedance setting may be a case where the switch 325 is being turned off and the load impedance of the carrier amplifier 321 is 50Ω.

The directional coupler 125 illustrated in FIG. 2 receives the input signal that is amplified by the power amplifier 122 from the impedance converter 324. The directional coupler 125 splits the received signal into two, and outputs one of the split signals to the filter circuit 126 and the other to the mixer 128.

The filter circuit 126 receives a signal from the directional coupler 125. The filter circuit 126 limits the signal to a given frequency band, and produces a transmission signal. The filter circuit 126 transmits the produced transmission signal to an external apparatus through the antenna 3.

The mixer 128 receives a signal from the directional coupler 125. The mixer 128 performs frequency conversion on the received signal to convert the received signal to the base band signal. The mixer 128 further performs a demodulation process and the like on the base band signal. Subsequently, the mixer 128 outputs the signal subjected to the respective processes to the AD converter 129.

The AD converter 129 receives the base band signal subjected to the demodulation process and the like from the mixer 128. The AD converter 129 converts the received signal from an analog signal to a digital signal. Subsequently, the AD converter 129 outputs the signal converted to a digital signal to the RF controller section 212 as the feedback signal.

Figure 8:
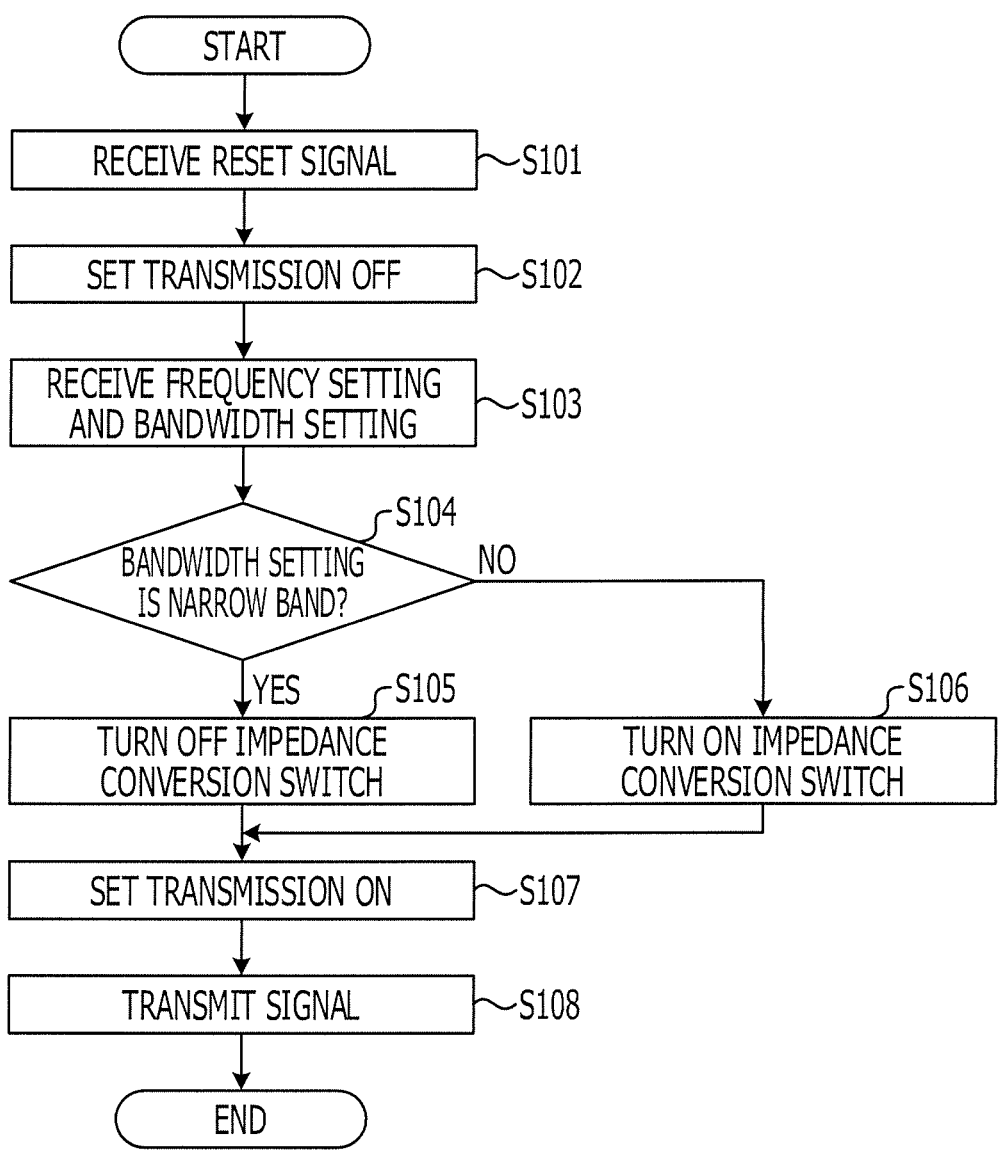
FIG. 8 illustrates an example of signal processing of a base station apparatus.

FIG. 8 illustrates an example of signal processing of a base station apparatus.

The CPRI interface section 101 receives a reset signal from the BBU 2 (Operation S101).

The transmitter controller section 211 receives the reset signal from the CPRI interface section 101. Upon receiving the reset signal, the transmission controller section 211 performs transmission-off setting (Operation S102) by sending instructions to respective sections such as the RF controller section 212 to turn off the transmission.

The CPRI interface section 101 receives frequency setting, bandwidth setting, or the like from the BBU 2 (Operation S103).

The transmission controller section 211 receives various setting such as the frequency setting, the bandwidth setting, or the like from the CPRI interface section 101. The transmission controller section 211 performs various setting of signal transmission. The transmission controller section 211 determines whether or not the bandwidth setting is the narrow band (Operation S104). For example, in a case where the correspondence table 400 illustrated in FIG. 3 is used, the transmission controller section 211 may determine that the bandwidth setting is the narrow band when the bandwidth setting is 1 MHz or 5 MHz. The transmission controller section 211 may determine that the bandwidth setting is not the narrow band when the bandwidth setting is 10 MHz or 20 MHz.

When the bandwidth setting is determined as the narrow band (Operation S104: affirmative), the transmission controller section 211 transmits an instruction to the impedance controller section 127 to turn off the switch 325 for impedance conversion. Upon receiving the instruction to turn off the switch 325, the impedance controller section 127 turns off the switch 325 of the impedance converter 324 (Operation S105).

When the bandwidth setting is determined as not the narrow band (Operation S104: negative), the transmission controller section 211 transmits an instruction to the impedance controller section 127 to turn on the switch 325 for impedance conversion. Upon receiving the instruction to turn on the switch 325, the impedance controller section 127 turns on the switch 325 of the impedance converter 324 (Operation S106).

The transmission controller section 211 performs transmission-on setting by sending instructions to respective sections such as the RF controller section 212 or the like (Operation S107).

Subsequently, the transmitter section 102 receives an input signal from the BBU 2 and performs the distortion compensation, the DA conversion, the orthogonal transformation, the amplifying, the filtering, or the like to produce an transmission signal. The transmitter section 102 transmits the transmission signal to an external apparatus through the antenna 3 (Operation S108).

In the base station apparatus, the load impedance of the carrier amplifier is changed when the bandwidth of input signal is narrow. Thus, the peak power of the Doherty amplifier circuit may increase, and the linearity may be improved even when the input signal has a narrow bandwidth. The noise standard may be met even when the bandwidth is narrow and the noise removing effect of the filter is low.

To decide the impedance change, the bandwidth of input signal and the transmission power setting may also be used. The base station apparatus may also have, for example, the configuration illustrated in FIG. 1 and FIG. 2. Descriptions of respective sections may be omitted or reduced.

FIG. 9 illustrates an example of a correspondence table between a bandwidth, a transmission power, and a control of an impedance converter. The transmission controller section 211 may store a correspondence table 401 such as one illustrated in FIG. 9. As illustrated in FIG. 9, the control information that is on or off of the switch 325 of the impedance converter 324 in association with a combination of the bandwidth setting and the transmission power setting is described in the correspondence table 401.

The transmission controller section 211 obtains the bandwidth setting and the transmission power setting of input signal from the control signal received from the CPRI interface section 101.

The transmission controller section 211 obtains the control information that corresponds to the obtained combination of the bandwidth setting and the transmission power setting from the correspondence table 401. The transmission controller section 211 instructs the impedance controller section 127 to control the impedance converter 324 in response to the obtained control information.

For example, when the bandwidth setting included in the control signal is 1 MHz and the transmission power setting is equal to or less than 10 W, the transmission controller section 211 instructs the impedance controller section 127 to turn off the switch 325. When the bandwidth setting included in the control signal is 1 MHz and the transmission power setting is equal to or larger than 10 W, the transmission controller section 211 instructs the impedance controller section 127 to turn on the switch 325.

The base station apparatus controls the load impedance by using the bandwidth and the transmission power. Thus, a more detailed control may be carried out, and the linearity may be suitably improved.

In the base station apparatus, a plurality of capacitors may be coupled to the impedance converter. This base station apparatus may also have the configuration illustrated in FIG. 1 and FIG. 2. Descriptions of respective sections may be omitted or reduced.

Figure 10:
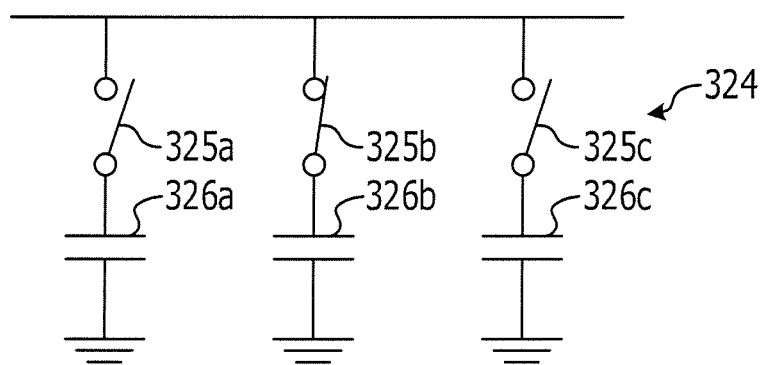
FIG. 10 illustrates an example of an impedance converter.

FIG. 10 illustrates an example of an impedance converter. As illustrated in FIG. 10, in the impedance converter 324, a switch 325a and a capacitor 326a, a switch 325b and a capacitor 326b, and a switch 325c and a capacitor 326c are arranged in parallel to the transmission line. Positions of respective pairs of the switch and the capacitor on the transmission line are determined according to setting conditions such as the frequency of input signal or the like so as that the load impedance of the carrier amplifier 321 becomes substantially equal to the load impedance of the impedance converter 324 when the bandwidth is the narrow band.

The transmission controller section 211 stores, for example, combinations of frequencies and switches including the switches 325a, 325b, and 325c. The transmission controller section 211 obtains the bandwidth setting as well as the transmission power setting of input signal from the control signal received from the CPRI interface section 101. The transmission controller section 211 identifies the switch that corresponds to the obtained frequency from the switches 325a, 325b, and 325c. The transmission controller section 211 controls on and off of the identified switch according to the bandwidth.

In this base station apparatus, the load impedance is converted by changing the position to which the capacitor is to be coupled in response to the setting conditions of input signal. When the bandwidth is the narrow band, suitable load impedance may be set in response to the setting of input signal, and the linearity may be suitably improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wireless communication apparatus comprising:
a first amplifier configured to amplify an input signal;
a second amplifier configured to amplify the input signal when an input level of the input signal is equal to or larger than a given level;
an impedance converter configured to switch a load impedance of the first amplifier and output a composite output comprising an output from the first amplifier and an output from the second amplifier, the impedance converter comprising a first capacitor coupled to a transmission channel via a first switch;
an impedance controller section configured to control a switching of the load impedance of the first amplifier such that a first switching is performed as the switching when a bandwidth of the input signal is equal to or less than a given value and a second switching is performed as the switching when the bandwidth of the input signal is greater than the given value;
a distortion compensation section configured to perform distortion compensation of the input signal and output a compensated input signal to the first amplifier and the second amplifier; and
a filter section configured to limit a band of a signal output from the impedance converter.

2. The wireless communication apparatus according to claim 1,
a transmission channel configured to transmit the composite output.

3. The wireless communication apparatus according to claim 2, wherein the load impedance of the first amplifier is switched based on a state of the first switch.

4. The wireless communication apparatus according to claim 1, wherein the impedance converter further comprises a second capacitor coupled to the transmission channel via a second switch.

5. The wireless communication apparatus according to claim 1, wherein the impedance controller section is further configured to control the switching to become the first switching such that the load impedance or the first amplifier becomes substantially equal to an impedance at an output of the impedance converter when the bandwidth of the input signal is equal to or less than the given value.

6. The wireless communication apparatus according to claim 1, wherein the impedance controller section is further configured to control the switching to become the first switching such that the load impedance of the first amplifier becomes substantially equal to an impedance at an output of the impedance converter when the bandwidth of the input signal is equal to or less than the given value and transmission power of the input signal is equal to or less than a given power.

7. The wireless communication apparatus according to claim 1, wherein the impedance controller section is further configured to control the switching to become the second switching such that the load impedance of the first amplifier becomes larger than an impedance at an output of the impedance converter when the bandwidth of the input signal is greater than the given value.

8. The wireless communication apparatus according to claim 7, wherein the impedance controller section is further configured to control the switching to become the second switching such that the load impedance of the first amplifier becomes twice the impedance at the output of the impedance converter.

9. The wireless communication apparatus according to claim 1, wherein the impedance controller section is further configured to control the switching of the load impedance of the first amplifier based on a transmission power level of the input signal.

10. The wireless communication apparatus according to claim 1, wherein the given value is approximately one-third of a maximum bandwidth of the input signal.

11. A Doherty amplifier comprising:
a first amplifier configured to amplify an input signal;
a second amplifier configured to amplify the input signal when a level of the input signal is equal to or larger than a given level;
an impedance converter configured to switch a load impedance of the first amplifier and output a composite output comprising an output from the first amplifier and an output from the second amplifier, the impedance converter comprising a first capacitor coupled to a transmission channel via a first switch; and
an impedance controller section configured to control a switching of the load impedance of the first amplifier based on a bandwidth of the input signal such that a first switching is performed as the switching of the load impedance of the first amplifier when the bandwidth of the input signal is equal to or less than a given value and a second switching is performed as the switching when the bandwidth of the input signal is greater than the given value.

12. A method for controlling wireless communication comprising:
performing distortion compensation of an input signal and supplying the compensated input signal to a first amplifier and a second amplifier;
amplifying the input signal via the first amplifier;
amplifying the input signal via the second amplifier when an input level of the input signal is equal to or larger than a given level;
switching an load impedance of the first amplifier such that a first switching is performed as the switching when a bandwidth of the input signal is equal to or less than a given value and a second switching is performed as the switching when the bandwidth of the input signal is greater than the given value;
outputting to an impedance converter a composite output comprising an output from the first amplifier and an output from the second amplifier based on a bandwidth of the input signal, the impedance converter comprising a first capacitor coupled to a transmission channel via a first switch; and
limiting a band of a signal output from an impedance converter.

13. A wireless communication apparatus comprising:
a first amplifier configured to amplify an input signal;
a second amplifier configured to amplify the input signal when an input level of the input signal is equal to or larger than a given level;
an impedance converter configured to switch a load impedance of the first amplifier and receive a composite output comprising an output from the first amplifier and an output from the second amplifier;
an impedance controller section configured to control a switching of the load impedance of the first amplifier based on a bandwidth of the input signal; and
a distortion compensation section configured to perform distortion compensation of the input signal and supply a compensated input signal to the first amplifier and the second amplifier,
wherein the impedance converter includes:
a transmission channel configured to transmit the composite output; and
a first capacitor coupled to the transmission channel via a first switch.

14. The wireless communication apparatus according to claim 13, wherein the load impedance of the first amplifier is switched based on a state of the first switch.

15. The wireless communication apparatus according to claim 13, wherein the impedance converter comprises a second capacitor coupled to the transmission channel via a second switch.

16. The wireless communication apparatus according to claim 13, wherein the impedance controller section is further configured to control the switching so that the load impedance of the first amplifier becomes substantially equal to an impedance at an output of the impedance converter when the bandwidth of the input signal is equal to or less than a given value.

17. The wireless communication apparatus according to claim 13, wherein the impedance controller section is configured to control the switching such that the load impedance of the first amplifier becomes equal to an impedance at an output of the impedance converter when the bandwidth of the input signal is equal to or less than a given value and transmission power of the input signal is equal to or less than a given power.

18. The wireless communication apparatus according to claim 13, wherein the impedance controller section is configured to control the switching such that the load impedance of the first amplifier becomes larger than an impedance at an output of the impedance converter when the bandwidth of the input signal is greater than a given value.

19. The wireless communication apparatus according to claim 18, wherein the impedance controller section is configured to control the switching so that the load impedance of the first amplifier becomes twice the impedance at the output of the impedance converter.

20. The wireless communication apparatus according to claim 13, further comprising a filter section configured to limit a band of a signal output from the impedance converter.

* * * * *